United States Patent
Furutani et al.

(10) Patent No.: US 6,928,298 B2
(45) Date of Patent: Aug. 9, 2005

(54) MOBILE COMMUNICATION DEVICE AND HIGH-FREQUENCY COMPOSITE UNIT USED IN THE SAME

(75) Inventors: Koji Furutani, Okayama (JP); Takanori Uejima, Okayama-ken (JP); Tetsuro Harada, Shiga-ken (JP); Yoshiki Takada, Okayama-ken (JP); Norio Nakajima, Takatsuki (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 498 days.

(21) Appl. No.: 09/801,497

(22) Filed: Mar. 8, 2001

(65) Prior Publication Data

US 2001/0027119 A1 Oct. 4, 2001

(30) Foreign Application Priority Data

Mar. 23, 2000 (JP) ........................ 2000-082364

(51) Int. Cl.⁷ .............................................. H04M 1/00
(52) U.S. Cl. .................................................. 455/553.1
(58) Field of Search .................................. 455/115, 126, 455/552.1, 553.1, 115.1; 330/126, 129, 286, 295

(56) References Cited

U.S. PATENT DOCUMENTS

| | | | |
|---|---|---|---|
| 5,692,290 A | | 12/1997 | Mamada et al. |
| 5,936,504 A | | 8/1999 | Hatakenaka |
| 5,973,568 A | * | 10/1999 | Shapiro et al. ............. 330/295 |
| 6,076,253 A | | 6/2000 | Takayama et al. |
| 6,154,664 A | * | 11/2000 | Chorey et al. ............. 455/571 |
| 6,215,988 B1 | * | 4/2001 | Matero .................... 455/188.1 |
| 6,216,012 B1 | * | 4/2001 | Jensen .................... 455/553.1 |
| 6,332,071 B1 | * | 12/2001 | Brandt ....................... 455/82 |
| 6,400,963 B1 | * | 6/2002 | Glockler et al. ......... 455/563.1 |
| 6,633,748 B1 | * | 10/2003 | Watanabe et al. ............ 455/78 |

FOREIGN PATENT DOCUMENTS

| | | |
|---|---|---|
| EP | 0 893 887 A2 | 1/1999 |
| EP | 0 921 642 A2 | 6/1999 |
| EP | 0 933 880 A2 | 8/1999 |
| GB | 2 333 669 A | 7/1999 |
| JP | 10-303761 | 11/1998 |
| JP | 2000-49651 | 2/2000 |
| JP | 2002-124427 | 4/2002 |
| JP | 2002-252132 | 9/2002 |

* cited by examiner

Primary Examiner—Vivian Chin
Assistant Examiner—Sanh Phu
(74) Attorney, Agent, or Firm—Keating & Bennett, LLP

(57) ABSTRACT

A mobile communication device, preferably in the form of a dual-band cellular phone, includes two communications systems supporting different frequency bands, such as DCS in the 1.8 GHz band and GSM in the 900 MHz band. The mobile communication device includes an antenna, a high-frequency composite unit, DCS and GSM transmitters, and DCS and GSM receivers. The high-frequency composite unit contains a diplexer, DCS and GSM high-frequency switches, DCS and GSM high-frequency filters or notch filters, and a directional coupler.

14 Claims, 7 Drawing Sheets

MOBILE COMMUNICATION DEVICE AND HIGH-FREQUENCY COMPOSITE UNIT USED IN THE SAME

BACKGROUND OF THE INVENTION

1. Field of the Invention

The present invention relates to a mobile communication device and a high-frequency composite unit included therein, and more particularly, to a mobile communication device capable of operating in a plurality of different mobile communication systems, and a high-frequency composite unit used in such systems.

2. Description of the Related Art

In the state of the art, a dual-band cellular phone device capable of operating in communication systems supporting a plurality of frequency bands, such as the Digital Cellular System (DCS) using the 1.8 GHz band and the Global System for Mobile communications (GSM) using the 900 MHz band, has been proposed as a mobile communication device for use in Europe.

FIG. 9 is a block diagram showing a portion of a typical dual-band cellular phone device including a combination of DCS using the 1.8 GHz band and GSM using the 900 MHz band, by way of example. The dual-band cellular phone device includes an antenna 1, a diplexer 2, and two communication systems, DCS and GSM.

The diplexer 2 transmits transmission signals from the two communication systems, DCS and GSM, to the antenna 1, and distributes reception signals received via the antenna 1 to the two communication systems of DCS and GSM. The DCS network includes a high-frequency switch 3a for switching signals between a transmitter Txd and a receiver Rxd, and a low-pass filter 4a and a directional coupler 5a, which are subsequent to the high-frequency switch 3a and are connected to the transmitter Txd. The GSM network includes a high-frequency switch 3b for switching signals between a transmitter Txg and a receiver Rxg, and a low-pass filter 4b and a directional coupler 5b, which are subsequent to the high-frequency switch 3a and are connected to the transmitter Txg. The low-pass filters 4a and 4b are located between the high-frequency switches 3a and 3b and the directional couplers 5a and 5b, respectively, such that harmonic distortion caused by transmission power amplifiers (not shown) incorporated in the transmitters Txd and Txg is removed. The directional couplers 5a and 5b extract portions of the transmission signals, and send the results to automatic gain control circuits (not shown) to maintain constant gains of the transmission signals.

The operation of the dual-band cellular phone device is described below. For DCS transmission, the high-frequency switch 3a turns on the transmitter Txd. A transmission signal sent from the transmitter Txd through the directional coupler 5a, the low-pass filter 4a, and the high-frequency switch 3a is selected by the diplexer 2, and is transmitted from the antenna 1. For DCS reception, on the other hand, a reception signal received by the antenna 1 is selected by the diplexer 2, and the high-frequency switch 3a turns on the receiver Rxd before the reception signal is passed to the receiver Rxd. For GSM transmission and reception, the same operations are performed.

However, the foregoing dual-band cellular phone device, which is one conventional mobile communication device, has a problem as described below. That is, a directional coupler for extracting portions of transmission signals and sending the results to an automatic gain control circuit is disposed in each of the DCS and GSM transmission paths, thus increasing the number of components required on a circuit substrate. This results in a dual-band cellular phone device (mobile communication device) having an increased size.

Another problem is that since an antenna, a diplexer, DCS and GSM high-frequency switches, DCS and GSM high-frequency filters (i.e., low-pass filters), and DCS and GSM directional couplers are mounted on a single circuit substrate in a discrete fashion, matching circuits which achieve matching, attenuation, or isolation characteristics are further required between the diplexer and the high-frequency switches, between the high-frequency switches and the high-frequency filters, and between the high-frequency filters and the directional couplers. Therefore, the number of components is further increased, thereby greatly increasing the required mounting area, and ultimately increasing the size of the circuit substrate. This results in a large dual-band cellular phone device (mobile communication device).

SUMMARY OF THE INVENTION

To overcome the above-described problems with the prior art, preferred embodiments of the present invention provide a mobile communication device which eliminates the need for a matching circuit and includes a compact circuit, and a high-frequency composite unit used in the same.

To this end, in one preferred embodiment of the present invention, a mobile communication device having a plurality of communication systems supporting different frequency bands includes an antenna, a transmitter for each of the communication systems, and a receiver for each of the communication systems. The mobile communication device further includes a diplexer for transmitting transmission signals from the plurality of communication systems to the antenna, and for distributing reception signals received via the antenna to the plurality of communication systems, a high-frequency switch for each of the communication systems for switching the signals between the transmitter and the receiver, and a directional coupler for extracting portions of the transmission signals, and for sending the results to an automatic gain control circuit. The directional coupler is preferably disposed between the antenna and the diplexer.

The mobile communication device also preferably includes high-frequency filters subsequent to the high-frequency switches and connected to the receivers.

In another preferred embodiment of the present invention, a high-frequency composite unit used in the mobile communication device includes a microwave circuit carrying the plurality of communication systems. The high-frequency composite unit is preferably defined by a multilayer substrate formed by laminating a plurality of dielectric layers, and the multilayer substrate includes the diplexer, the high-frequency switches and the directional coupler.

In the high-frequency composite unit, preferably, the diplexer includes an inductance element and a capacitance element, the high-frequency switch includes a switching element, an inductance element, and a capacitance element, and the directional coupler includes a primary line and a secondary line. These components are either contained in or mounted on the multilayer substrate. The multilayer substrate preferably includes connectors for connecting these components to one another.

Accordingly, a mobile communication device according to preferred embodiments of the present invention provides a directional coupler between an antenna and a diplexer, thus eliminating the necessity for separate directional couplers to be provided for a plurality of communication systems. Therefore, only one directional coupler is required for the mobile communication device.

A high-frequency composite unit according to preferred embodiments of the present invention includes a diplexer, high-frequency switches, and a directional coupler, which are provided in a multilayer substrate made by laminating a plurality of dielectric layers. Therefore, the connectors for the diplexer, the high-frequency switches, and the directional coupler are incorporated in the multilayer substrate.

Other features, characteristics, elements and advantages of the present invention will become more apparent from the following detailed description of preferred embodiments thereof with reference to the attached drawings.

DETAILED DESCRIPTION OF PREFERRED EMBODIMENTS

Figure 1:
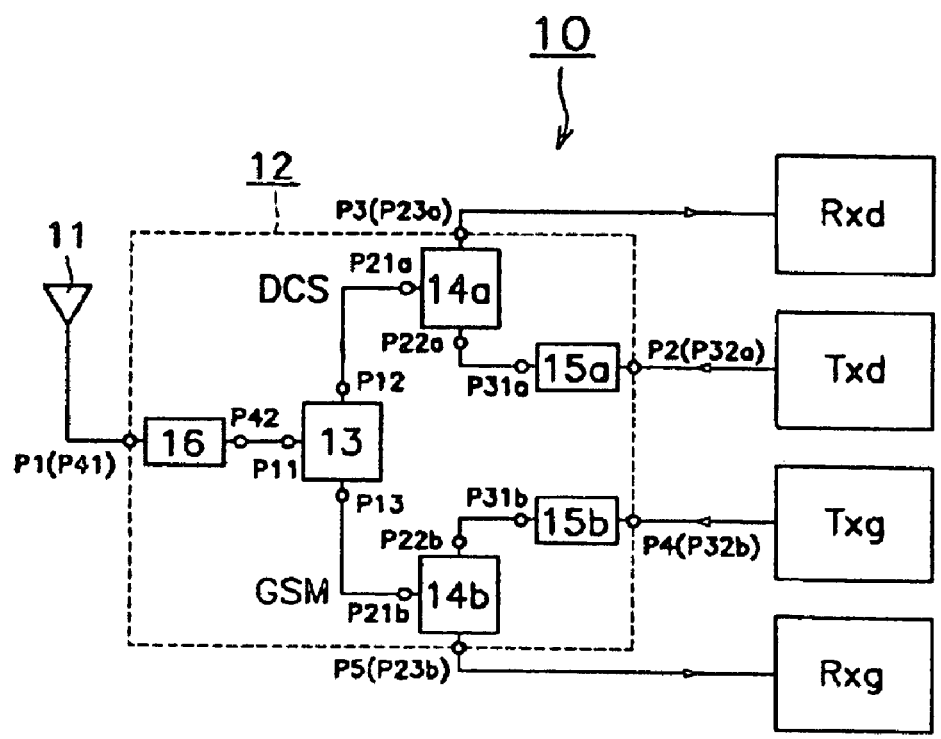
FIG. 1 is a block diagram of a mobile communication device according to a preferred embodiment of the present invention.

FIG. 1 shows a mobile communication device 10 according to a preferred embodiment of the present invention. The mobile communication device 10 is preferably a dual-band cellular phone device having two different frequency band communication systems, namely, DCS, which is a 1.8 GHz communication system, and GSM, which is a 900 MHz communication system. The mobile communication device 10 includes an antenna 11, high-frequency composite unit 12, surrounded by a dashed line in FIG. 1, transmitters Txd and Txg, and receivers Rxd and Rxg.

The high-frequency composite unit 12 preferably includes first to fifth ports P1 to P5, a diplexer 13, high-frequency switches 14a and 14b, notch filters 15a and 15b, defining high-frequency filters, and a directional coupler 16.

The diplexer 13 sends transmission signals from the two communication systems, DCS and GSM, to the antenna 11, and distributes reception signals received via the antenna 11 to the two communication systems, DCS and GSM.

The high-frequency switch 14a is switched to pass DCS signals from the transmitter Txd and to the receiver Rxd, and the high-frequency switch 14b is switched to pass GSM signals from the transmitter Txg and to the receiver Rxg.

The notch filters 15a and 15b are located between the high-frequency switches 14a and 14b and the transmitters Txd and Txg, respectively, such that harmonic distortion caused by transmission power amplifiers PA incorporated in the transmitters Txd and Txg is removed.

The directional coupler 16 which extracts portions of DCS and GSM transmission signals and sends the results to an automatic gain control circuit AGC is disposed between the antenna 11 and the diplexer 13. The DCS and GSM transmission signals are discriminated by changing the degree of coupling of the directional coupler 16 depending upon the DCS frequency band or the GSM frequency band.

The first port P1 corresponds to a first port P41 of the directional coupler 16. The second and fourth ports P2 and P4 correspond to second ports P32a and P32b of the notch filters 15a and 15b, respectively. The third and fifth ports P3 and P5 correspond to third ports P23a and P23b of the high-frequency switches 14a and 14b, respectively.

A first port P11 of the diplexer 13 is connected to a second port P42 of the directional coupler 16, and second and third ports P12 and P13 of the diplexer 13 are connected to first ports P21a and P21b of the high-frequency switches 14a and 14b, respectively.

Second ports P22a and P22b of the high-frequency switches 14a and 14b are connected to first ports P31a and P31b of the notch filters 15a and 15b, respectively.

The first port P1, the second port P2, the third port P3, the fourth port P4, and the fifth port P5 of the high-frequency composite unit 12 are connected to the antenna 11, the DCS transmitter Txd, the DCS receiver Rxd, the GSM transmitter Txg, and the GSM receiver Rxg, respectively.

Figure 2:
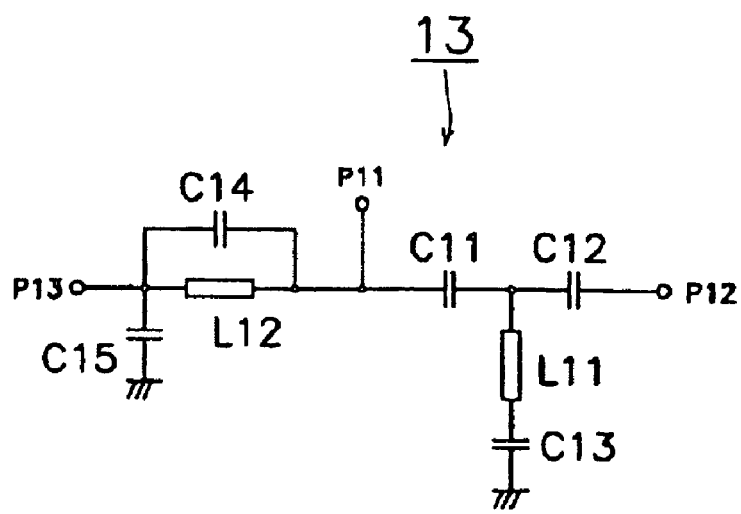
FIG. 2 is a circuit diagram of a diplexer in a high-frequency composite unit shown in FIG. 1.

FIG. 2 is a circuit diagram of the diplexer 13 in the high-frequency composite unit 12 shown in FIG. 1.

The diplexer 13 includes inductors or inductance elements L11 and L12, and capacitors or capacitance elements C11 to C15. The capacitors C11 and C12 are connected in series between the first port P11 and the second port P12, and the junction of the capacitors C11 and C12 is grounded through the inductor L11 and the capacitor C13.

A parallel circuit of the inductor L12 and the capacitor C14 is connected between the first port P11 and the third port P13, and the junction of the parallel circuit and the third port P3 is grounded through the capacitor C15.

In other words, a high-pass filter is defined between the first port P11 and the second port P12, having a pass band through which only the DCS (in a high frequency band) transmission/reception signals, which lead to the second port P12, are transmitted. A low-pass filter is defined between the first port P11 and the third port P13, having a pass band through which only the GSM (in a low frequency band) transmission/reception signals, which lead to the third port P13, are transmitted.

Figure 3A:
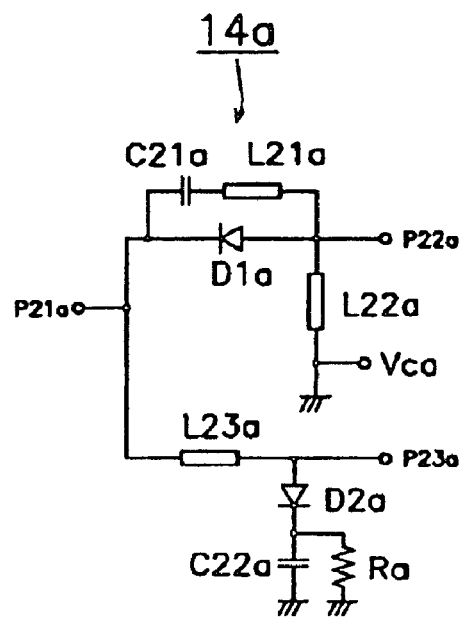
FIGS. 3A and 3B are circuit diagrams of high-frequency switches in the high-frequency composite unit shown in FIG. 1.
Figure 3B:
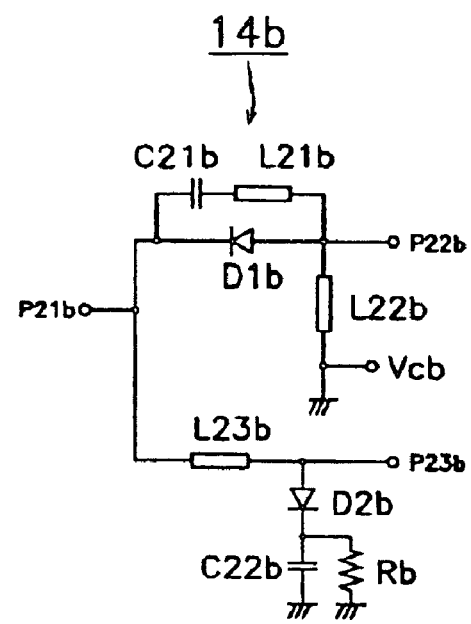

FIGS. 3A and 3B are circuit diagrams respectively showing the DCS high-frequency switch 14a and the GSM high-frequency switch 14b in the high-frequency composite unit 12 shown in FIG. 1.

As illustrated in FIGS. 3A and 3B, since the DCS high-frequency switch 14a and the GSM high-frequency switch 14b have the same circuit structure, a description of the GSM high-frequency switch 14b is omitted; however reference numerals corresponding to those of the DCS high-frequency switch 14a are given in parentheses.

The high-frequency switch 14a (14b) includes diodes or switching elements D1a and D2a (D1b and D2b), inductors or inductance elements L21a to L23a (L21b to L23b), capacitors or capacitance elements C21a and C22a (C21b and C22b), and a resistor Ra (Rb). The inductor L21a (L21b) is a parallel trap coil, and the inductor L22a (L22b) is a choke coil.

The diode D1a (D1b) is connected between the first port P21a (P21b) and the second port P22a (P22b) with the cathode being directed to the first port P21a (P21b). A serial circuit of the inductor L21a (L21b) and the capacitor C21a (C21b) is connected in parallel to the diode D1a (D1b).

The anode of the diode D1a (D1b), which is connected to the second port P22a (P22b), is grounded through the inductor L22a (L22b), and a control terminal Vca (Vcb) is connected to a node between the inductor L22a (L22b) and the ground.

The inductor L23a (L23b) is connected between the first port P21a (P21b) and the third port P23a (P23b), and a junction of the inductor L23a (L23b) and the third port P23a (P23b) is grounded through the diode D2a (D2b) and the capacitor C22a (C22b). The junction of the cathode of the diode D2a (D2b) and the capacitor C22a (C22b) is grounded through the resistor Ra (Rb).

Figure 4A:
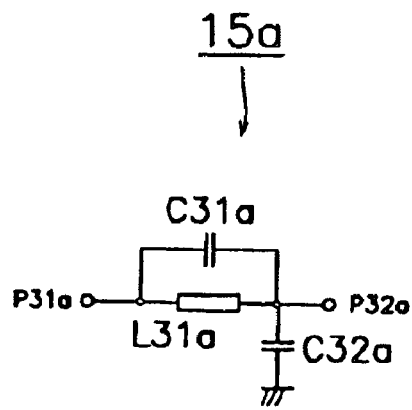
FIGS. 4A and 4B are circuit diagrams of high-frequency filters in the high-frequency composite unit shown in FIG. 1.
Figure 4B:
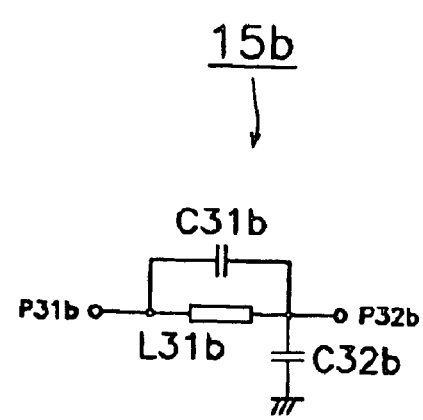

FIGS. 4A and 4B are circuit diagrams respectively showing the DCS notch filter or high-frequency filter 15a and the GSM notch filter or high-frequency filter 15b in the high-frequency composite unit 12 shown in FIG. 1.

As illustrated in FIGS. 4A and 4B, since the DCS notch filter 15a and the GSM notch filter 15b have the same circuit structure, a description of the GSM notch filter 15b is omitted. However, reference numerals corresponding to those of the DCS notch filter 15a are shown in parentheses.

The notch filter 15a (15b) includes an inductor or inductance element L31a (L31b), and capacitors or capacitance elements C31a and C32a (C31b and C32b). A parallel circuit of the inductor L31a (L31b) and the capacitor C31a (C31b) is connected between the first port P31a (P31b) and the second port P32a (P32b).

The junction of the parallel circuit and the second port P32a (P32b) is grounded through the capacitor C32a (C32b).

Figure 5:
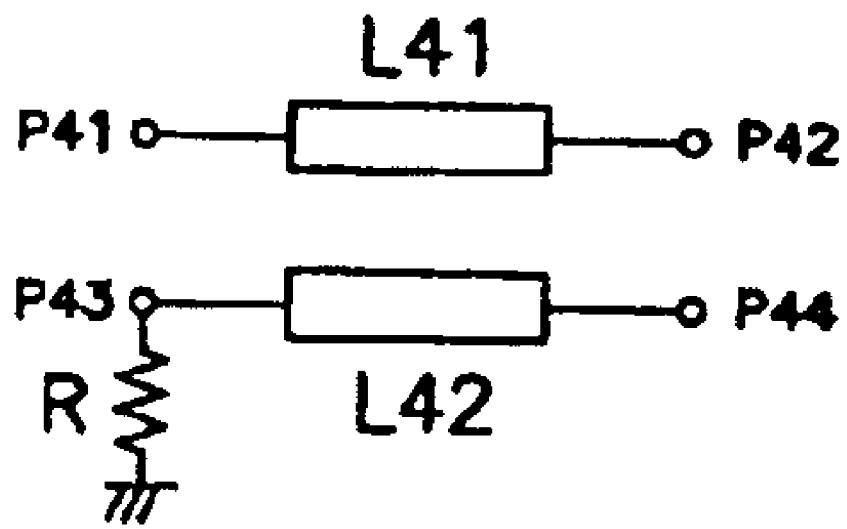
FIG. 5 is a circuit diagram of a directional coupler incorporated in the high-frequency composite unit shown in FIG. 1.

FIG. 5 is a circuit diagram of the directional coupler 16 in the high-frequency composite unit 12 shown in FIG. 1.

The directional coupler 16 includes a primary line L41 and a secondary line L42. The primary line L41 is coupled to the first and second ports P41 and P42 at its ends, and the secondary line L42 is coupled to third and fourth ports P43 and P44 at its ends.

The third port P43 is grounded through a resistor R, and the fourth port P44 is connected to an automatic gain control circuit, although it is not shown.

Figure 6:
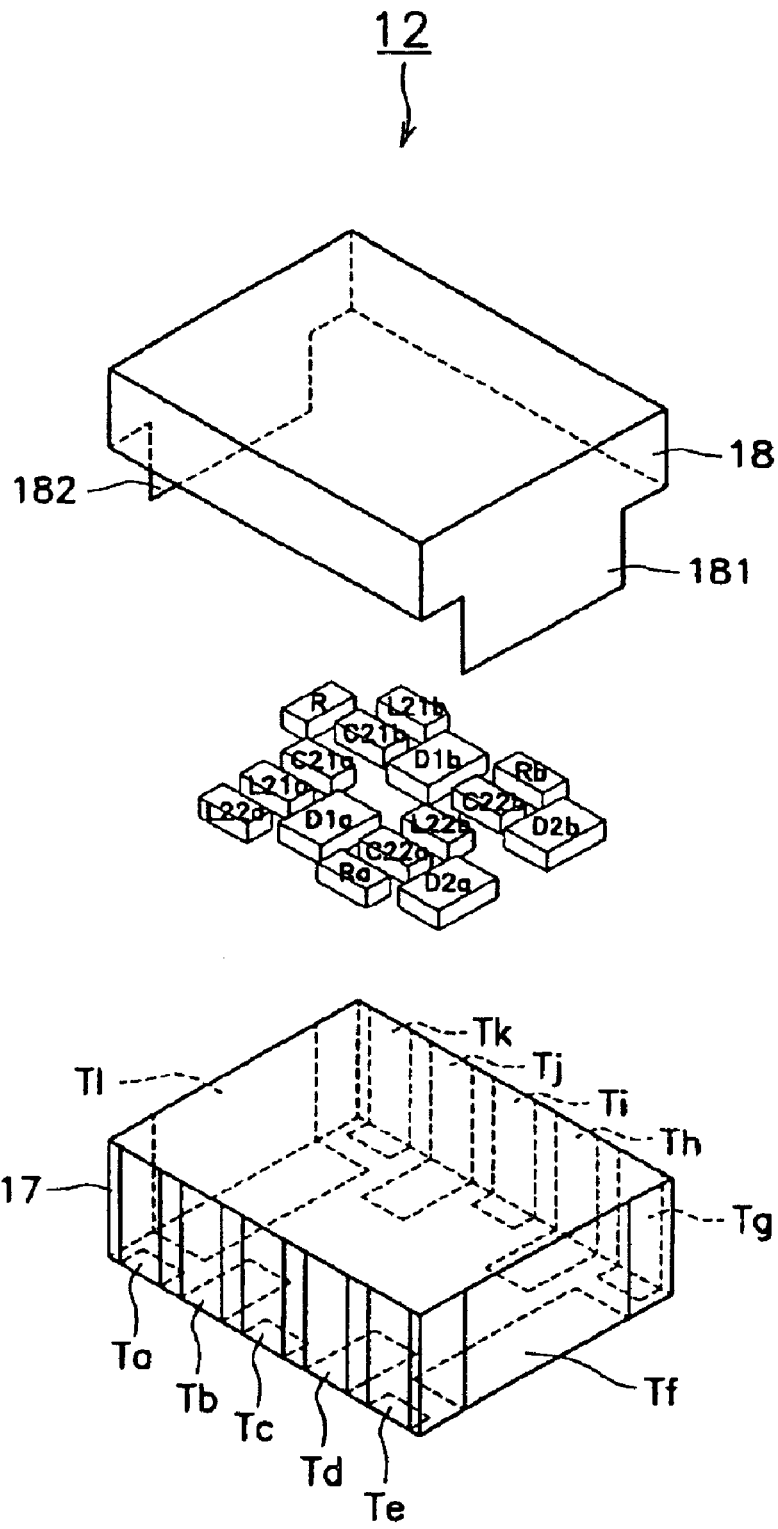
FIG. 6 is a partially exploded perspective view of the high-frequency composite unit shown in FIG. 1.

FIG. 6 is a partially exploded perspective view of the high-frequency composite unit 12 shown in FIG. 1. The high-frequency composite unit 12 includes a multilayer substrate 17 which is preferably formed by laminating a plurality of dielectric layers.

The multilayer substrate 17 contains the inductors L11 and L12, and the capacitors C11 to C15 of the diplexer 13 (see FIG. 2), the inductors L23a and L23b of the high-frequency switches 14a and 14b (see FIGS. 3A and 3B), the inductors L31a and L31b, and the capacitors C31a, C32a, C31b, and C32b of the notch filters 16a and 16b (see FIGS. 4A and 4B), and the primary and secondary lines L41 and L42 of the directional coupler 16, although these components are not shown in FIG. 6.

Mounted on a surface of the multilayer substrate 17 are the diodes D1a, D2a, D1b, and D2b, the inductors L21a, L22a, L21b, and L22b, the capacitors C21a, C22a, C21b, and C22b, and the resistors Ra and Rb of the high-frequency switches 14a and 14b (see FIGS. 3A and 3B), and the resistor R connected to the third port P43 in the directional coupler 16. These components are defined by chips, and these chips are mounted on the multilayer substrate 17.

The multilayer substrate 17 has twelve external terminals Ta to Tl extending over side surfaces towards the bottom surface using a technique such as screen printing. The twelve external terminals Ta to Tl are connected to the first to fifth ports P1 to P5 of the high-frequency composite unit 12, the control terminals Vca and Vcb of the high-frequency switches 14a and 14b, the fourth port P44 connected to the automatic gain control circuit in the directional coupler 16, and ground.

A metal cap 18 having short projections 181 and 182, which face each other, lies over the multilayer substrate 17 to cover the chips mounted on the multilayer substrate 17 such that the projections 181 and 182 are placed against the external terminals Tf and Tl defining the ground terminals.

Connections between the directional coupler 16 and the diplexer 13, between the diplexer 13 and the high-frequency switches 14a and 14b, and between the high-frequency switches 14a and 14b and the notch filters 15a and 15b are provided by via-hole electrodes (not shown), etc., within the multilayer substrate 17.

Figure 7A:
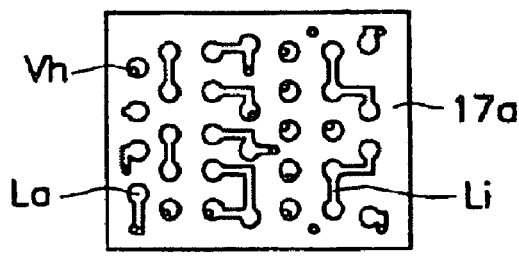
FIGS. 7A to 7H are top plan views of dielectric layers defining a multilayer substrate of the high-frequency composite unit shown in FIG. 6.
Figure 7B:
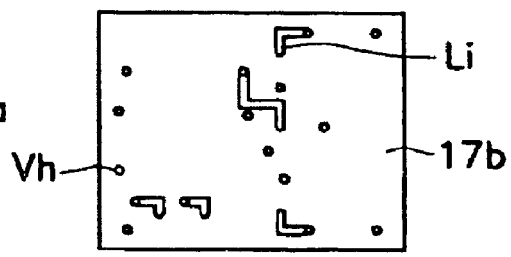
Figure 7C:
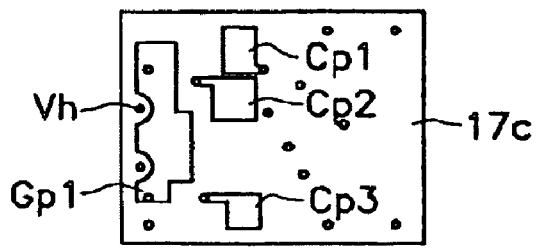
Figure 7D:
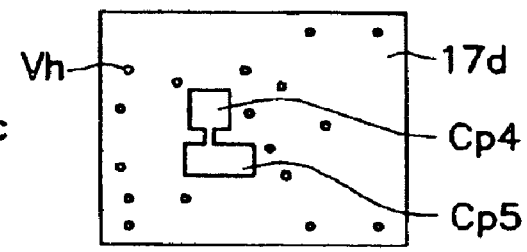
Figure 7E:
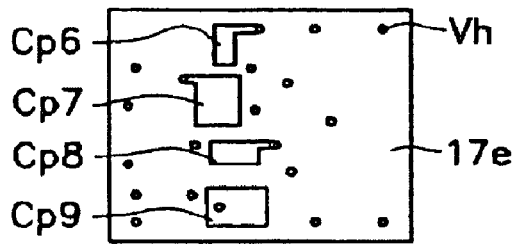
Figure 7F:
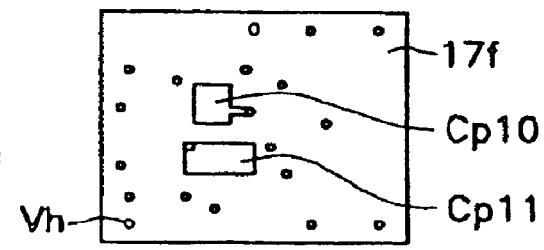

FIGS. 7A to 7H, and FIGS. 8A to 8F are top plan views of the plurality of dielectric layers defining the multilayer substrate 17 of the high-frequency composite unit 12 shown in FIG. 6. FIG. 8G is a bottom view of the dielectric layer shown in FIG. 8F.

The multilayer substrate 17 is preferably formed by laminating first to fourteenth dielectric layers 17a to 17n in the stated order from the top, which are made, for example, of ceramic essentially containing barium oxide, aluminum oxide, and silica, and by firing the laminate at a firing temperature not higher than about 1,000° C.

The first dielectric layer 17a includes lands La and lines Li provided on the upper surface thereof using a technique such as screen printing. The diodes D1a, D1b, D2a, and D2b, the inductors L21a, L21b, L22a, and L22b, the capacitors C21a, C21b, C22a, and C22b, and the resistors Ra, Rb, and R are mounted on the lands La.

Figure 7G:
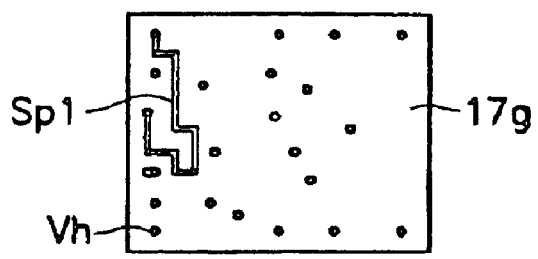
Figure 7H:
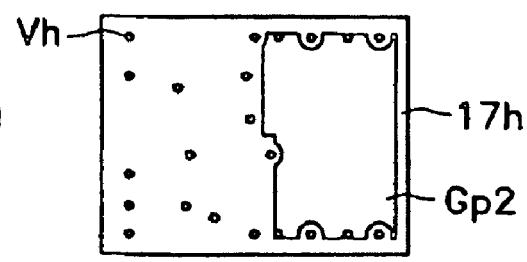
Figure 8A:
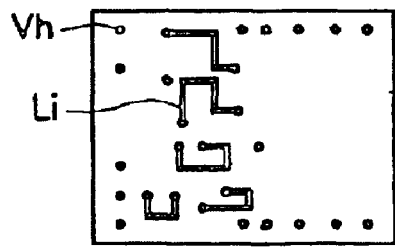
FIGS. 8A to 8F are top plan views of further dielectric layers defining the multilayer substrate of the high-frequency composite unit shown in FIG. 6.
Figure 8B:
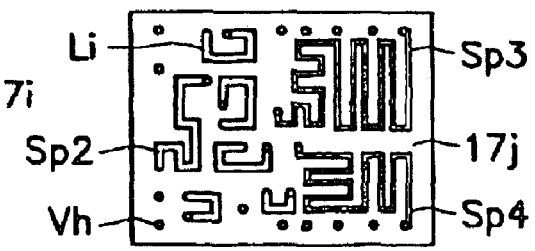
Figure 8C:
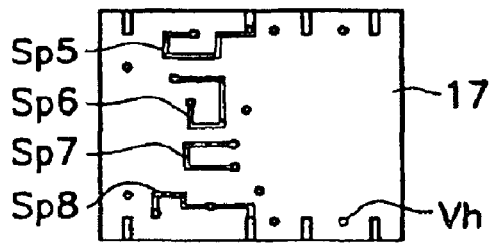
Figure 8D:
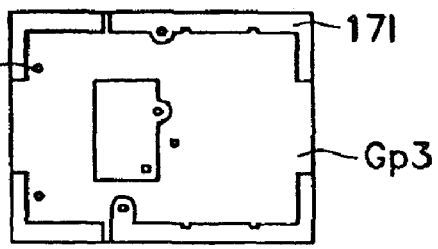
Figure 8E:
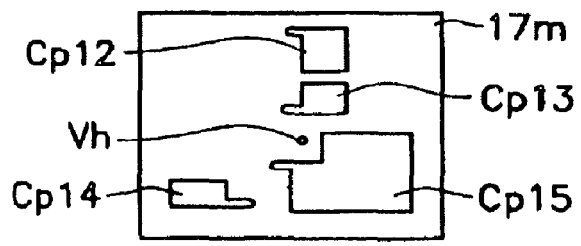
Figure 8F:
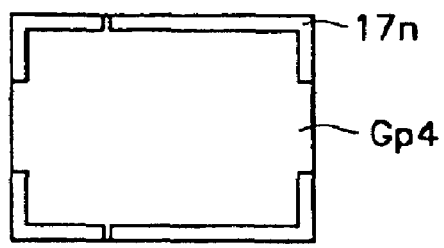
Figure 8G:
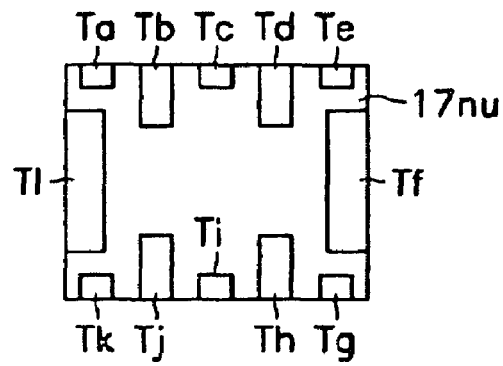
FIG. 8G is a bottom view of the dielectric layer shown in FIG. 8F.
Figure 9:
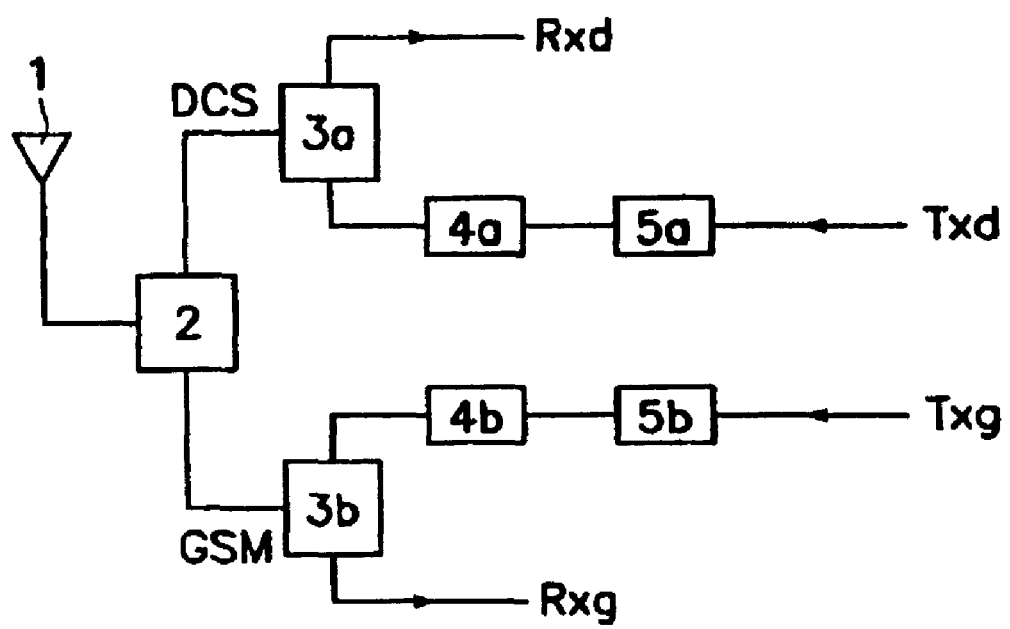
FIG. 9 is a block diagram showing a portion of a typical dual-band cellular phone device (mobile communication device).

In FIGS. 7G, 8B, and 8C, strip line electrodes Sp1 to Sp8 are provided on the upper surfaces of the seventh, tenth, and eleventh dielectric layers 17g, 17j, and 17k using a technique such as screen printing.

In FIGS. 7C to 7F, and 8E, capacitor electrodes Cp1 to Cp15 are provided on the upper surfaces of the third to sixth, and thirteenth dielectric layers 17c to 17f, and 17m using a technique such as screen printing.

In FIGS. 7C, 7H, 8D, and 8F, ground electrodes Gp1 to Gp4 are provided on the upper surfaces of the third, eighth, twelfth, and fourteenth dielectric layers 17c, 17h, 17l, and 17n using a technique such as screen printing.

In FIG. 8G, the external terminals Ta to Tl are printed and formed on bottom surface 17nu of the fourteenth dielectric layer 17n using a technique such as screen printing.

In FIGS. 7B, 8A, and 8B, the lines Li used as connectors are provided on the upper surfaces of the second, ninth, and tenth dielectric layers 17b, 17i, and 17j using a technique such as screen printing.

The strip line electrodes Sp1 to Sp8, the capacitor electrodes Cp1 to Cp15, and the ground electrodes Gp1 to Gp4 are each defined by conductor layers.

The first to thirteenth dielectric layers 17a to 17m have via-hole electrodes Vh used as connectors at predetermined positions to pass through the first to thirteenth dielectric layers 17a to 17m.

In the diplexer 11, the inductors L11 and L12 are defined by the strip line electrodes Sp7 and Sp6, respectively. In the high-frequency switches 14a and 14b, the inductors L23a and L23b are defined by the strip line electrodes Sp4 and Sp3, respectively.

In the high-frequency filters 15a and 15b, the inductors L31a and L31b are defined by the strip line electrodes Sp8 and Sp5, respectively. In the directional coupler 16, the primary and secondary lines L41 and L42 are defined by the strip line electrodes Sp2 and Sp1, respectively.

In the diplexer 11, the capacitor C11 is defined by the capacitor electrodes Cp2, Cp4, and Cp7; the capacitor C12 is defined by the capacitor electrodes Cp5, Cp8, and Cp11; the capacitor C13 is defined by the capacitor electrode Cp15 and the ground electrode Gp4; the capacitor C14 is defined by the capacitor electrodes Cp7 and Cp10; and the capacitor C15 is defined by the capacitor electrode Cp13 and the ground electrode Gp4.

In the notch filter 15a, the capacitor C31a is defined by the capacitor electrode Cp3 and Cp9; and the capacitor C32a is defined by the capacitor electrode Cp14 and the ground electrode Gp4. In the notch filter 15b, the capacitor C31b is defined by the capacitor electrode Cp1 and Cp6; and the capacitor C32b is defined by the capacitor electrode Cp12 and the ground electrode Gp4.

An operation of the high-frequency composite unit 12 incorporated in the mobile communication device 10 shown in FIG. 1 is described below.

For transmission of a DCS transmission signal in the 1.8 GHz band, a voltage of 3 V is applied to the control terminal Vca of the DCS high-frequency switch 14a. The diodes D1a and D2a are then turned on, and the DCS transmission signal is passed through the high-frequency switch 14a, the diplexer 13, and the directional coupler 16, and is transmitted from the antenna ANT connected to the first port P1 of the high-frequency composite unit 12.

At this time, a voltage of 0 V is applied to the control terminal Vcb of the GSM high-frequency switch 14b to turn off the diode D1b, preventing GSM transmission signals from being transmitted. The diplexer 13 prevents the DCS transmission signal from being passed to the GSM transmitter Txg and the GSM receiver Rxg. The notch filter 15a subsequent to the DCS high-frequency switch 14a and connected to the DCS transmitter Txd attenuates distortion of the DCS transmission signal, which is caused by a high power amplifier (not shown) incorporated in the transmitter Txd.

For transmission of a GSM transmission signal in the 900 MHz band, on the other hand, a voltage of 3 V is applied to the control terminal Vcb of the GSM high-frequency switch 14b. The diodes D1b and D2b are then turned on, and the GSM transmission signal is passed through the high-frequency switch 14b, the diplexer 13, and the directional coupler 16, and is transmitted from the antenna ANT connected to the first port P1 of the high-frequency composite unit 12.

At this time, a voltage of 0 V is applied to the control terminal Vca of the DCS high-frequency switch 14a to turn off the diode D1a, preventing DCS transmission signals from being transmitted. The diplexer 13 prevents the GSM transmission signal from being passed to the DCS transmitter Txd and the DCS receiver Rxd. The notch filter 15b subsequent to the high-frequency switch 14b and connected to the GSM transmitter Txg attenuates distortion of the GSM transmission signal, which is caused by a high power amplifier (not shown) incorporated in the transmitter Txg.

Next, for reception of DCS and GSM reception signals, a voltage of 0 V is applied to the control terminal Vca of the DCS high-frequency switch 14a to turn off the diodes D1a and D2a, and a voltage of 0 V is applied to the control terminal Vcb of the GSM high-frequency switch 14b to turn off the diodes D1b and D2b. This prevents the DCS reception signal from being undesirably passed to the DCS transmitter Txd, and also prevents the GSM reception signal from being undesirably passed to the GSM transmitter Txg.

The diplexer 13 prevents both DCS reception signals from being undesirably passed to the GSM network and GSM reception signals from being undesirably passed to the DCS network.

Accordingly, a mobile communication device of the illustrated preferred embodiment provides a directional coupler between an antenna and a diplexer, thus eliminating the need for separate directional couplers for a plurality of communication systems. Consequently, the mobile communication device only requires a single directional coupler. This allows for simplification in the wiring of transmitters, and allows for simplification in the manufacturing steps of a mobile communication device to achieve low-cost production. In addition, losses in the wiring are greatly reduced to greatly reduce the insertion loss for transmission, resulting in a high-performance mobile communication device.

Since separate directional couplers are not needed for a plurality of communication systems, and the mobile communication device requires a single directional coupler, a mobile communication device having a greatly reduced size is achieved.

Accordingly, a notch filter subsequent to a high-frequency switch and connected to a transmitter attenuates distortion of transmission signals caused by a high power amplifier incorporated in the transmitter. This greatly reduces the insertion loss at a receiver.

A high-frequency composite unit of the illustrated preferred embodiment is defined by a multilayer substrate preferably formed by laminating a plurality of dielectric layers, and the multilayer substrate incorporates a diplexer, high-frequency switches, notch filters, and a directional coupler. This enables connections among the diplexer, the high-frequency switches, the notch filters, and the directional coupler to be performed within the multilayer substrate. Therefore, a compact high-frequency composite unit is achieved, and thus a compact mobile communication device incorporating such a compact high-frequency composite unit is achieved.

Accordingly, a diplexer, high-frequency switches, notch filters, and a directional coupler are incorporated in a multilayer substrate made by laminating a plurality of dielectric layers. This facilitates matching between the directional coupler and the diplexer, between the diplexer and the high-frequency switches, and between the high-frequency switches and the notch filters. No matching circuit is thus required to provide matching between the directional coupler and the diplexer, between the diplexer and the high-frequency switches, and between the high-frequency switches and the notch filters. This results in an even more compact high-frequency composite unit.

A high-frequency filter used herein is a notch filter capable of attenuating only in the vicinity of second and third harmonics, which are desired to be attenuated, thus reducing the influence on the fundamental pass band. Therefore, in comparison with a filter, such as a low-pass filter or a band-pass filter, for attenuating the whole harmonic band, the insertion loss at the fundamental pass band is greatly reduced to greatly reduce the overall losses of a high-frequency composite unit.

In the illustrated preferred embodiment, a diplexer and a notch filter each preferably includes inductors and capacitors; a high-frequency switch preferably includes diodes, inductors, and capacitors; and a directional coupler preferably includes a primary line and a secondary line. These components are further provided in or mounted on a multilayer substrate, and are connected to one another by connectors provided within the multilayer substrate. This greatly reduces losses due to the wiring among the components. Hence, the overall losses of a high-frequency composite unit are greatly reduced while a high-performance mobile communication device incorporating such a high-frequency composite unit is achieved.

Accordingly, since strip line electrodes defining inductors are provided in a multilayer substrate, a wavelength-reduction effect occurs, allowing the length of the strip line electrodes to be greatly reduced. This greatly reduces the insertion loss at the strip line electrodes, achieving a compact high-frequency composite unit with low loss. Therefore, a compact and high-performance mobile communication device incorporating such a high-frequency composite unit is also achieved.

Furthermore, chip coils having high Q factors are used for parallel trap coils and choke coils in high-frequency switches, and are mounted on a multilayer substrate. Thus, chip coils having the same shape may be used in a plurality of different frequency-band communication systems. This enables the design to be easily changed depending upon various frequency bands, and the design to be changed in a shorter time, resulting in reduced manufacturing cost. The parallel trap coils and the choke coils having high Q factors further allow the pass band to be broader, achieving lower losses.

While the illustrated preferred embodiment has been described in which a mobile communication device and a high-frequency composite unit use a combination of DCS and GSM, it should be noted that the combination of DCS and GSM is not restrictive and other alternative combinations may be used. Other combinations include a combination of PCS (Personal Communication Services) and AMPS (Advanced Mobile Phone Services), a combination of DECT (Digital European Cordless Telephone) and GSM, and a combination of PHS (Personal Handyphone System) and PDS (Personal Digital Cellular).

While the illustrated preferred embodiment provides two communication systems, three or more communication systems would have the same advantages.

While a high-frequency composite unit used in a mobile communication device is formed of a multilayer substrate in the illustrated preferred embodiment, a mobile communication device incorporating discrete components packaged on a circuit substrate would have the same advantages.

While preferred embodiments of the present invention have been disclosed, various modes of carrying out the principles disclosed herein are contemplated as being within the scope of the following claims. Therefore, it is understood that the scope of the present invention is not to be limited except as otherwise set forth in the claims.

What is claimed is:

1. A mobile communication device having a plurality of communication systems supporting different frequency bands, comprising:

an antenna;
    a transmitter for each of the plurality or communication systems;
    a receiver for each of the plurality of communication systems;
    a diplexer transmitting transmission signals from the plurality of communication systems to said antenna, and distributing reception signals received via said antenna to the plurality of communication systems;
    a high-frequency switch for each of the plurality of communication systems, arranged to switch the signals between said transmitter and said receiver, said high-frequency switch being directly connected to said diplexer;
    a directional coupler extracting portions of the transmission signals, and sending the results to an automatic gain control circuit, said directional coupler being disposed between said antenna and said diplexer; and
    a high-frequency composite unit including a microwave circuit carrying the plurality of communication systems; wherein
    said high-frequency composite unit is defined by a multilayer substrate including a laminated body including a plurality of dielectric layers, the multilayer substrate having said diplexer, said high-frequency switches, and said directional coupler.

2. A mobile communication device according to claim 1, wherein said diplexer includes an inductance element and a capacitance element, said high-frequency switch includes a switching element, an inductance element, and a capacitance element, and said directional coupler includes a primary line and a secondary line, the multilayer substrate includes the switching element, the inductance element, the capacitance element, the primary line, and the secondary line, and the multilayer substrate includes a connector connecting the switching element, the inductance element, the capacitance element, the primary line, and the secondary line.

3. A mobile communication device according to claim 1, further comprising high-frequency filters, said high-frequency filters being arranged subsequent to said high-frequency switches and being connected to said receivers.

4. A mobile communication device according to claim 1, wherein said plurality of communication systems include DCS and GSM systems.

5. A mobile communication device according to claim 1, wherein a notch filter is provided between said transmitters and said high-frequency switches.

6. A mobile communication device according to claim 1, wherein said directional coupler includes a port.

7. A mobile communication device according to claim 1, wherein said diplexer includes inductance elements and capacitors.

8. A dual-band cellular phone device having two communication systems supporting different frequency bands, comprising:

an antenna;
    a transmitter for each of the two communication systems;
    a receiver for each of the two communication systems;
    a diplexer transmitting transmission signals from the two communication systems to said antenna, and distributing reception signals received via said antenna to the two communication systems;
    a high-frequency switch for each of the two communication systems, arranged to switch the signals between said transmitter and said receiver, said high-frequency switch being directly connected to said diplexer;

a directional coupler extracting portions of the transmission signals, and sending the results to an automatic gain control circuit, said directional coupler being disposed between said antenna and said diplexer; and a high-frequency composite unit including a microwave circuit carrying the two communication systems; wherein said high-frequency composite unit is defined by a multilayer substrate including a laminated body including a plurality of dielectric layers, the multilayer substrate having said diplexer, said high-frequency switches, and said directional coupler.

9. A dual-band cellular phone device according to claim 8, wherein said diplexer includes an inductance element and a capacitance element, said high-frequency switch includes a switching element, an inductance element, and a capacitance element, and said directional coupler includes a primary line and a secondary line, the multilayer substrate includes the switching element, the inductance element, the capacitance element, the primary line, and the secondary line, and the multilayer substrate further includes a connector connecting the switching element, the inductance element, the capacitance element, the primary line, and the secondary line.

10. A dual-band cellular phone device according to claim 8, further comprising high-frequency filters, said high-frequency filters being arranged subsequent to said high-frequency switches and being connected to said receivers.

11. A dual-band cellular phone device according to claim 8, wherein said two communication systems include DCS and GSM systems.

12. A dual-band cellular phone device according to claim 8, wherein a notch filter is provided between said transmitters and said high-frequency switches.

13. A dual-band cellular phone device according to claim 8, wherein said directional coupler includes a port.

14. A dual-band cellular phone device according to claim 8, wherein said diplexer includes inductance elements and capacitors.

* * * * *